United States Patent
Kim et al.

(10) Patent No.: US 7,235,818 B2
(45) Date of Patent: Jun. 26, 2007

(54) FLIP CHIP TYPE NITRIDE SEMICONDUCTOR LIGHT EMITTING DEVICE AND MANUFACTURING METHOD THEREOF

(75) Inventors: Hyun Kyung Kim, Kyungki-do (KR); Yong Chun Kim, Kyungki-do (KR); Hyoun Soo Shin, Seoul (KR)

(73) Assignee: Samsung Electro-Mechanics Co., Ltd, Kyungki-Do (KR)

( * ) Notice: Subject to any disclaimer, the term of this patent is extended or adjusted under 35 U.S.C. 154(b) by 0 days.

(21) Appl. No.: 10/861,511

(22) Filed: Jun. 7, 2004

(65) Prior Publication Data

US 2005/0145875 A1 Jul. 7, 2005

(30) Foreign Application Priority Data

Dec. 24, 2003 (KR) ........................ 10-2003-0096025

(51) Int. Cl.
*H01L 33/00* (2006.01)
(52) U.S. Cl. .......................... 257/98; 257/82; 257/95; 257/99; 257/778; 257/E33.068
(58) Field of Classification Search ................ 257/778, 257/79, 82, E33.006, E33.068, 95, 85–87, 257/99, E33.028, E33.063, 98, 103
See application file for complete search history.

(56) References Cited

U.S. PATENT DOCUMENTS

| | | | | |
|---|---|---|---|---|
| 5,438,018 A * | 8/1995 | Mori et al. | ................. | 438/492 |
| 5,818,625 A * | 10/1998 | Forgette et al. | ............. | 359/267 |
| 5,990,500 A | 11/1999 | Okazaki | ........................ | 257/99 |
| 6,081,001 A * | 6/2000 | Funato et al. | ................. | 257/94 |
| 6,614,058 B2 * | 9/2003 | Lin et al. | ........................ | 257/99 |
| 6,693,352 B1 * | 2/2004 | Huang et al. | ................. | 257/743 |
| 6,803,603 B1 * | 10/2004 | Nitta et al. | ..................... | 257/79 |
| 6,812,502 B1 * | 11/2004 | Chien et al. | ................... | 257/99 |
| 6,815,725 B2 * | 11/2004 | Sugawara et al. | ............. | 257/89 |
| 6,825,502 B2 * | 11/2004 | Okazaki et al. | ................ | 257/98 |
| 6,831,265 B2 * | 12/2004 | Yoneda et al. | ........... | 250/214 R |
| 6,842,470 B2 * | 1/2005 | Omi et al. | ............. | 372/45.013 |
| 6,900,472 B2 * | 5/2005 | Kondoh et al. | ................ | 257/94 |
| 6,936,859 B1 * | 8/2005 | Uemura et al. | ................ | 257/99 |
| 2002/0014630 A1 | 2/2002 | Okazaki et al. | ................ | 257/79 |
| 2004/0222434 A1 | 11/2004 | Uemura et al. | ................ | 257/99 |

* cited by examiner

*Primary Examiner*—Kenneth Parker
*Assistant Examiner*—Chris C. Chu
(74) *Attorney, Agent, or Firm*—Lowe Hauptman & Berner

(57) ABSTRACT

Disclosed herein are a flip chip type nitride semiconductor light emitting device, which comprises a substrate for growing a nitride semiconductor material, an n-type nitride semiconductor layer formed on the substrate, an active layer formed on at least a part of the n-type nitride semiconductor layer, a p-type nitride semiconductor layer formed on the active layer, a bonding force providing layer formed on the p-type nitride semiconductor layer and adapted to provide a bonding force relative to the p-type nitride semiconductor layer, a reflective electrode layer formed on the bonding force providing layer, and adapted to reflect light produced in the active layer toward the substrate and to diffuse electric current, and a cap layer formed on the reflective electrode layer, and adapted to provide a bonding force between the reflective electrode layer and a bonding metal and to reduce contact resistance.

9 Claims, 5 Drawing Sheets

FLIP CHIP TYPE NITRIDE SEMICONDUCTOR LIGHT EMITTING DEVICE AND MANUFACTURING METHOD THEREOF

BACKGROUND OF THE INVENTION

1. Field of the Invention

The present invention relates to a nitride semiconductor light emitting device and a manufacturing method thereof, and more particularly to a flip chip type nitride semiconductor light emitting device and its manufacturing method wherein a p-metal layer of the nitride semiconductor light emitting device, which has a flip chip structure, comprises three layers, namely, a bonding force providing layer, a reflective electrode layer, and a cap layer, so as to enhance a bonding force between the p-metal layer and a p-type nitride semiconductor layer of the device, to improve efficiencies of reflection and electric current diffusion, and to reduce contact resistance, resulting in enhanced brightness and driving voltage qualities of the device.

2. Description of the Related Art

Currently, in order to enable such a nitride semiconductor light emitting device to be utilized as a next-generation lighting apparatus, there exists a requirement of developing a nitride semiconductor light emitting device so as to have a high-brightness quality. As a prior art technology for satisfying this requirement there has been proposed as follows.

FIG. 1 is a sectional view illustrating one example of a conventional nitride semiconductor light emitting device. As shown in FIG. 1, the exemplary conventional nitride semiconductor light emitting device comprises an n-type nitride semiconductor layer 12, an active layer 13 with a multiple quantum well structure, and a p-type nitride semiconductor layer 14, which are successively stacked on a substrate 11 in multiple layers. The p-type nitride semiconductor layer 14 and the active layer 13 are partially removed at their side regions, respectively, so that a part of an upper surface of the n-type nitride semiconductor layer 12 is exposed to the outside. On the exposed upper surface region of the n-type nitride semiconductor layer 12 is mounted an n-side electrode 18. Afterwards on the p-type nitride semiconductor layer 14 is formed a p-metal layer 15, which is for forming an ohmic contact and for improving injection efficiency of electric current, a p-side bonding electrode 19 is formed on the p-metal layer 15. The p-metal layer 15 has a light transmission property and acts to reduce contact resistance, thereby serving to improve injection efficiency of electric current. In general, as such a p-metal layer is employed a transparent conductor layer consisting of Ni/Au double layers.

The Ni/Au double layers are metal layers having a relatively good light transmissivity. As they are deposited in a very thin layer of 100 Å or less, light produced inside the light emitting device is emitted to the outside through metals. Although it is preferable that the Ni/Au double layers are deposited in a thickness as thick as possible in order to improve injection efficiency of electric current, due to the fact that a transparent electrode is formed by using metals, such a thick thickness may be an obstacle in view of desired light transmittance quality. Even if the light transmittance quality can be enhanced through additional heat treatment process of the light emitting device, since a resulting light transmittance ratio is approximately 60% at the most, such an increase in thickness of the Ni/Au double layers may cause deterioration in brightness of the nitride semiconductor light emitting device. Therefore, the thickness of the Ni/Au double layers are inevitably restricted, and thus have a limitation in improvement in injection efficiency of electric current.

In order to solve a problem of the conventional nitride semiconductor light emitting device shown in FIG. 1, there has been proposed in the prior art a flip chip type nitride semiconductor light emitting device as shown in FIG. 2. This flip chip type nitride semiconductor light emitting device, in the same manner as the above described conventional nitride semiconductor light emitting device shown in FIG. 1, comprises an n-type nitride semiconductor layer 22, an active layer 23 with a multiple quantum well structure, and a p-type nitride semiconductor layer 24, which are successively stacked on a substrate 21 in multiple layers, and the p-type nitride semiconductor layer 24 and the active layer 23 are partially removed at their side regions, respectively, so that a part of an upper surface of the n-type nitride semiconductor layer 22 is exposed to the outside. Then, on the exposed upper surface region of the n-type nitride semiconductor layer 22 is mounted an n-side electrode 28, and on the p-type nitride semiconductor layer 24 is mounted a p-metal layer 25. The p-metal layer 25 is made of Al, Ag, and the like having a good reflectivity. After that, a p-side bonding electrode 29 is mounted on the p-metal layer 25. In use, by reversing the obtained nitride semiconductor light emitting device, the n-side electrode 28 and the p-side bonding electrode 29 are connected to conductive patterns provided on a submount 201 by interposing bumps 202, respectively. In case of this flip chip type nitride semiconductor light emitting device, the p-metal layer 25 is made of the above mentioned metals having a good reflectivity in order to effectively reflect light, which is intended to proceed into directions of the electrodes, thereby causing the light to be emitted to the outside through the transparent substrate 21. In this way, it is impossible to improve brightness of the light emitting device and to facilitate dissipation of heat, which is generated inside the light emitting device by the electrodes, to the outside.

The p-metal layer 25, however, has a problem in that its constituent Ag presents a very low bonding force relative to the p-type nitride semiconductor layer 24, thereby causing generation of poor products and making it difficult to ensure a stable contact resistance quality. Although other metals including Al, Ni, Ti, Pt, and the like is usable to constitute the p-metal layer 25, these metals have a low reflectivity compared to Ag.

Therefore, there still exists in the art a requirement of developing a new p-metal layer, which has a good bonding force relative to a p-type nitride semiconductor layer, presents a high brightness quality, and can achieve stable electrical qualities, such as electric current diffusion and contact resistance.

SUMMARY OF THE INVENTION

Therefore, the present invention has been made in view of the above problems, and it is an object of the present invention to provide a flip chip type nitride semiconductor light emitting device and a manufacturing method thereof, the device having a p-metal layer, which can achieve a good bonding force relative to a p-type nitride semiconductor layer of the device, can enhance brightness of the device through a good reflectivity, and can improve electric current diffusion and contact resistance qualities.

In accordance with one aspect of the present invention, the above and other objects can be accomplished by the provision of a flip chip type nitride semiconductor light emitting device comprising: a substrate for growing a nitride semiconductor material; an n-type nitride semiconductor layer formed on the substrate; an active layer formed on at least a part of the n-type nitride semiconductor layer; a p-type nitride semiconductor layer formed on the active layer; a bonding force providing layer formed on the p-type nitride semiconductor layer and adapted to provide a bonding force relative to the p-type nitride semiconductor layer; a reflective electrode layer formed on the bonding force providing layer, and adapted to reflect light produced in the active layer toward the substrate and to diffuse electric current; and a cap layer formed on the reflective electrode layer, and adapted to provide a bonding force between the reflective electrode layer and a bonding metal and to reduce contact resistance.

Preferably, the bonding force providing layer may be made of one metal or alloys of two or more metals selected from among the group consisting of Ni, Co, Pd, Ir, Rh, Ru, Zn, Mg, and Sn, and may have a thickness of 5 Å to 50 Å.

Preferably, the reflective electrode layer may be made of one metal or alloys of two or more metals selected from among the group consisting of Ag, Rh and Al, and may have a thickness of 500 Å to 5000 Å.

Preferably, the cap layer may be made of one metal selected from among the group consisting of Pt, Pd and Ph, and may have a thickness of 100 Å or more while being smaller than that of the reflective electrode layer.

In accordance with another aspect of the present invention, there is provided a method of manufacturing a flip chip type nitride semiconductor light emitting device comprising the steps of: a) preparing a substrate for growing a nitride semiconductor material; b) successively forming, on the substrate, an n-type nitride semiconductor layer, an active layer, and a p-type nitride semiconductor layer; c) removing at least a part of the p-type nitride semiconductor layer and at least a part of the active layer so as to expose a partial region of the n-type nitride semiconductor layer; d) forming a bonding force providing layer on the p-type nitride semiconductor layer so as to provide a bonding force relative to the p-type nitride semiconductor layer; e) forming a reflective electrode layer on the bonding force providing layer so as to reflect light produced in the active layer toward the substrate, and to achieve diffusion of electric current; and f) forming a cap layer on the reflective electrode layer so as to provide a bonding force between the reflective electrode layer and a bonding metal, and to reduce contact resistance.

Preferably, after the step f), the method may further comprise the steps of: g) performing a heat treatment process; and h) forming an n-side electrode on the exposed partial region of the n-type nitride semiconductor layer, and a p-side bonding electrode on the cap layer, and, in the step g) the heat treatment process may be a rapid heat treatment process performed at a temperature of 400° C. to 600° C. for 1 minute to 5 minutes under nitrogen atmosphere.

Preferably, the step d) may be performed by depositing one metal or alloys of two or more metals selected from among the group consisting of Ni, Co, Pd, Ir, Rh, Ru, Zn, Mg, and Sn on the p-type nitride semiconductor layer in a thickness of 5 Å to 50 Å, the step e) may be performed by depositing one metal or alloys of two or more metals selected from among the group consisting of Ag, Rh and Al on the bonding force providing layer in a thickness of 500 Å to 5000 Å, and the step f) may be performed by depositing one metal selected from among the group consisting of Pt, Pd and Ph in a thickness of 100 Å or more while being smaller than that of the reflective electrode layer.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Reference will now be made in greater detail to a preferred embodiment of the invention, an example of which is illustrated in the accompanying drawings.

Figure 1:
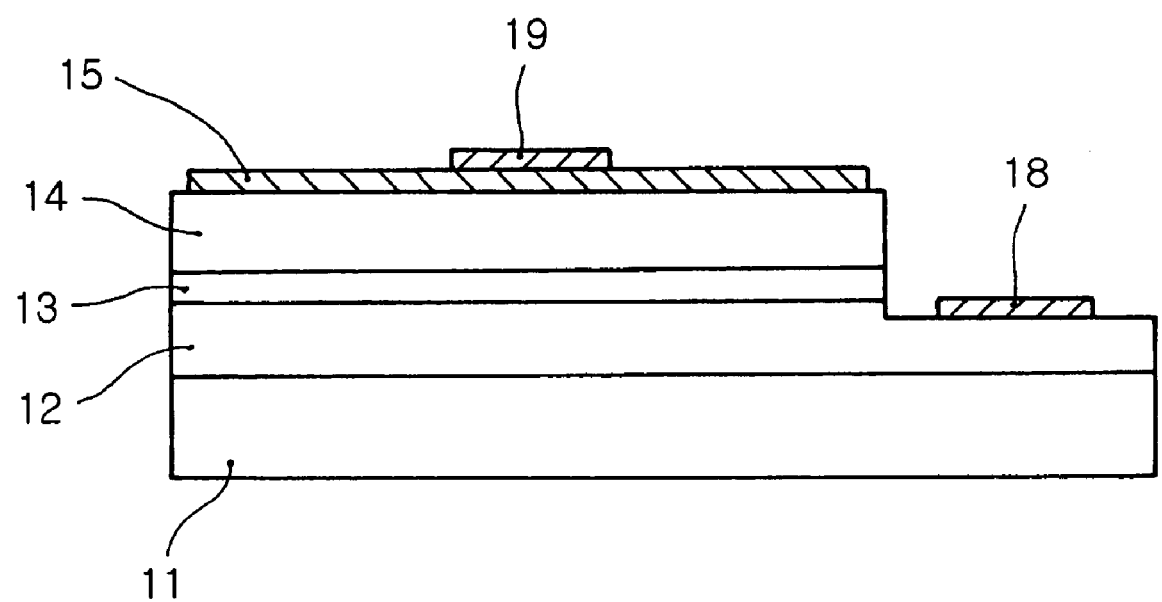
FIG. 1 is a sectional view illustrating one example of a conventional nitride semiconductor light emitting device.
Figure 2:
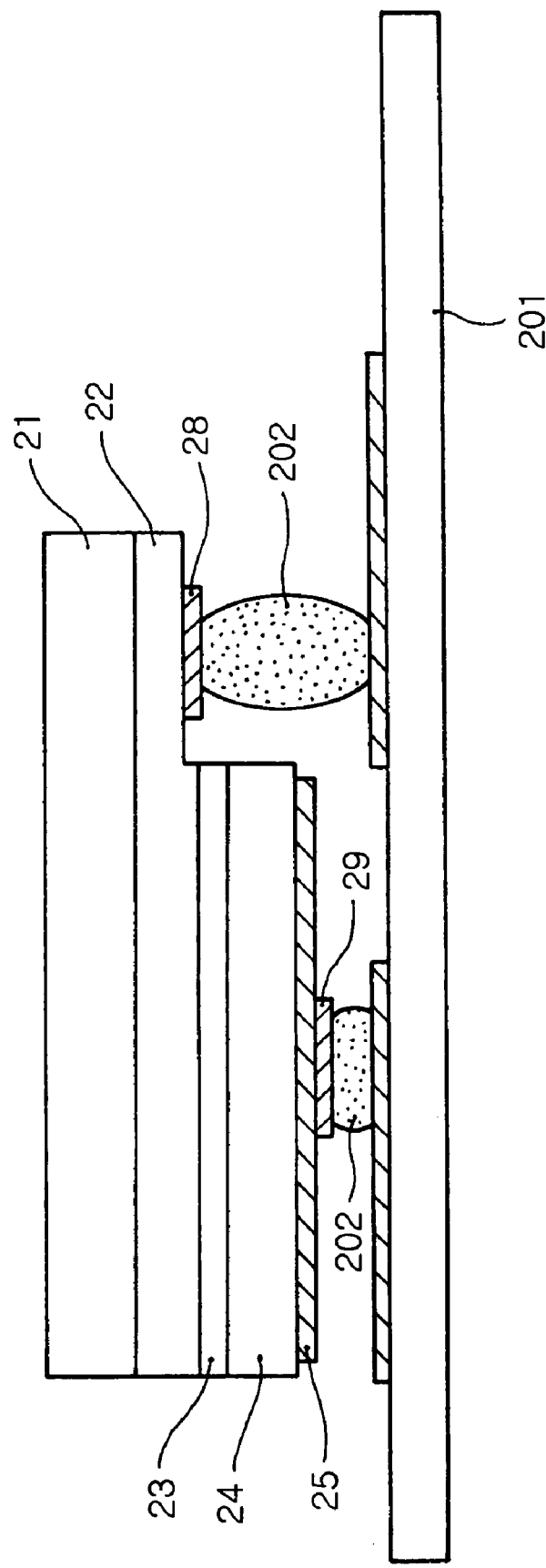
FIG. 2 is a sectional view illustrating another example of a conventional nitride semiconductor light emitting device.
Figure 3:
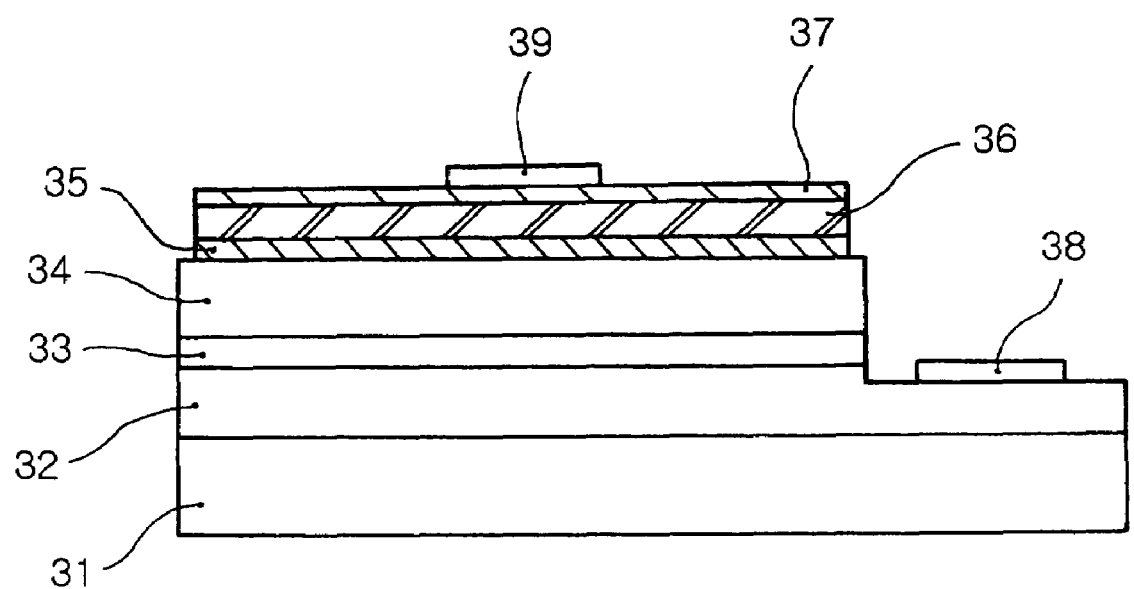
FIG. 3 is a sectional view illustrating a nitride semiconductor light emitting device in accordance with the present invention.

FIG. 3 is a sectional view illustrating a flip chip type nitride semiconductor light emitting device in accordance with the present invention. Referring to FIG. 3, the flip chip type nitride semiconductor light emitting device of the present invention comprises a substrate 31, an n-type nitride semiconductor layer 32 formed on the substrate 31, an active layer 33 formed on at least a part of the n-type nitride semiconductor layer 32, a p-type nitride semiconductor layer 34 formed on the active layer 33, a bonding force providing layer 35 which is formed on the p-type nitride semiconductor layer 34 and adapted to provide a bonding force relative to the p-type nitride semiconductor layer 34, a reflective electrode layer 36 which is formed on the bonding force providing layer 35 and adapted to reflect light produced in the active layer 33 toward the substrate 31 and diffuse electric current, and a cap layer 37 which is formed on the reflective electrode layer 36 and adapted to provide a bonding force between the reflective electrode layer 36 and a bonding metal and reduce contact resistance. The nitride semiconductor light emitting device of the present invention is further provided with an n-side electrode 38 on an exposed surface region of the n-type nitride semiconductor layer 32, and a p-side bonding electrode 39 on an upper surface of the cap layer 37.

The substrate 31 is selected from among a sapphire substrate and a SiC substrate, and especially, the sapphire substrate is more representative. This is because there exist no commercial substrates having the same crystal structure as that of a nitride semiconductor material to be grown on the substrate 31, and capable of achieving lattice matching.

The n-type nitride semiconductor layer 32 may be made of an Si-doped semiconductor material having a composition represented by $Al_xIn_yGa_{(1-x-y)}N$ ($0 \leq x \leq 1$, $0 \leq y \leq 1$, $0 \leq x+y \leq 1$), and especially, GaN is widely used as such an Si-doped semiconductor material. The n-type nitride semiconductor layer 32 is obtained by growing the Si-doped semiconductor material on the substrate 31 through the use of a known deposition method such as an MOCVD (metal organic chemical vapor deposition) method, or MBE (molecular beam epitaxy) method. In case of the growth of a nitride semiconductor material on a sapphire substrate, since it is difficult to anticipate high quality crystal growth due to the stress of lattice mismatching, a low temperature growth layer, which is also referred to as a buffer layer, may be previously formed on the substrate before the n-type nitride semiconductor layer. Such a buffer layer may be made of GaN, and the like.

The active layer 33 has a quantum well structure, and may be made of GaN or InGaN.

The p-type nitride semiconductor layer 34, in the same manner as the n-type nitride semiconductor layer 32, is made of a nitride semiconductor material having a composition represented by $Al_xIn_yGa_{(1-x-y)}N$ ($0 \leq x \leq 1$, $0 \leq y \leq 1$, $0 \leq x+y \leq 1$), and the nitride semiconductor material is p-dopped. The p-type nitride semiconductor layer 34, in the same manner as the n-type nitride semiconductor layer 32, is grown on the active layer 33 by using a known deposition method such as an MOCVD method or MBE method.

At an upper surface of the p-type nitride semiconductor layer 34 is formed a p-metal layer in order to improve electric current diffusion and to reduce contact resistance. In case of the flip chip type nitride semiconductor light emitting device, especially, it has to present a good reflectivity. The p-metal layer of the flip chip type nitride semiconductor light emitting device according to the present invention comprises the bonding force providing layer 35, reflective electrode layer 36, and cap layer 37.

Now, respective layers of the p-metal layer according to the present invention will be explained.

First, the bonding force providing layer 35 is formed on the p-type nitride semiconductor layer 34 for providing a required bonding force between the p-metal layer and the p-type nitride semiconductor layer 34. In general, since Ag constituting a reflective layer of the flip chip type nitride semiconductor light emitting device has a very low bonding force relative to the p-type semiconductor layer, there is a problem in that the reflective layer is easily separated from the p-type nitride semiconductor layer, thereby causing generation of poor products. The bonding force providing layer 35 is formed to have a thin thickness by using a metal having a good adhesive property relative to the p-type nitride semiconductor layer 34, and can solve a poor bonding force problem of the reflective layer made of Ag. Examples of a constituent material of the bonding force providing layer 35 may include one metal selected from among the group consisting of Ni, Co, Pd, Ir, Rh, Ru, Zn, Mg, and Sn. Alternately, the bonding force providing layer 35 may be made of alloys of two or more metals selected from among the above enumerated metals.

In addition to a function for providing a bonding force between the p-metal layer and the p-type nitride semiconductor layer 34, since the bonding force providing layer 35 has to transmit as much light as possible toward the reflective electrode layer 36 formed at an upper surface thereof, it is preferably formed to have a thickness as thin as possible. Therefore, the thickness of the bonding force providing layer 35 is in the range of 5 Å to 50 Å. Taking into account a general size of metal particles corresponding to approximately 2 Å to 3 Å, it is substantially impossible to form the bonding force providing layer 35 to have an extremely thin thickness less than 5 Å. On the other hand, if the thickness of the bonding force providing layer 35 is greater than 50 Å, the bonding force providing layer 35 excessively absorbs light, resulting in deterioration in brightness of the light emitting device.

The bonding force providing layer 35 may be formed by using an E-beam deposition method or thermal deposition method, which are well known in the art.

Secondly, the reflective electrode layer 36 is formed on the bonding force providing layer 35 and is adapted to reflect light produced in the active layer 33 toward the substrate 31 and diffuse electric current. The reflective electrode layer 36 may be made of one metal selected from among the group consisting of Ag, Rh and Al, which have a good reflectivity and a very low electric resistance. Alternately, the reflective electrode layer 36 may be made of alloys of two or more metals selected from among the above enumerated metals.

Since the reflective electrode layer 36 has to reflect light produced in the active layer 33 toward the substrate 31, preferably, it is formed to have a thick thickness in order to improve reflectivity. Moreover, since the reflective electrode layer 36 has to widely diffuse electric current, in order to reduce electric resistance and thus improve efficiency of electric current diffusion, the reflective electrode layer 36 is preferably formed to have such a thick thickness. As the thickness of the reflective electrode layer 36 is increased, however, the reflective electrode layer 36 inevitably confronts a reduction in bonding force thereof, thereby increasing the probability of generating poor products. Therefore, in consideration of reflectivity, electric resistance, and bonding force, it is most preferable that the thickness of the reflective electrode layer 36 is in a range between 500 Å and 5000 Å. If the thickness of the reflective electrode layer 36 is less than 500 Å, it deteriorates reflectivity, and prevents smooth achievement of electric current diffusion, resulting in deterioration in brightness of the light emitting device. If the thickness of the reflective electrode layer 36 exceeds 500 Å, it deteriorates bonding force, resulting in separation of the reflective electrode layer 36.

The reflective electrode layer 36, in the same manner as the bonding force providing layer 35, may be formed by using a known E-beam deposition or thermal deposition method.

Finally, the cap layer 37 is formed at an upper surface of the reflective electrode layer 36 in order to secure a bonding force between the reflective electrode layer 36 and a bonding metal, and to reduce contact resistance therebetween. The cap layer 37 may be made of one metal selected from among the group consisting of Pt, Pd, and Rh. The cap layer 37 is formed on the reflective electrode layer 36 by using a known E-beam deposition or thermal deposition method. After formation of the cap layer 37, the nitride semiconductor light emitting device passes through a heat treatment process at a temperature of approximately 400° C. to 600° C. under nitrogen atmosphere. During such a heat treatment process, a part of a constituent material of the cap layer 37 penetrates through the reflective electrode layer 36 and the bonding force providing layer 35 in the form of a column until it reaches down to an interface between the p-type nitride semiconductor layer 34 and the bonding force providing layer 35. In this manner, as a part of the constituent material of the cap layer 37 comes into contact with the interface between the p-type nitride semiconductor layer 34 and the bonding force providing layer 35 through the heat treatment process, it has the affect of reducing contact resistance and thus achieves a reduction in a driving voltage of the nitride semiconductor light emitting device. Furthermore, the cap layer 37 is effective to improve a bonding force relative to the p-side bonding electrode 39 (further referred to as a bonding metal) formed at the upper surface thereof.

In order to achieve a reduction in contact resistance through its sufficient penetration as well as to provide a good bonding force relative to the p-side bonding electrode 39, it is preferable that a thickness of the cap layer 37 is 100 Å or more, but is smaller than that of the reflective electrode layer 36.

The present invention further provides a manufacturing method of the above described flip chip type nitride semiconductor light emitting device. FIGS. 4a to 4d are perspective views illustrating sequential steps of the manufacturing method of the flip chip type nitride semiconductor light emitting device in accordance with the present invention.

Figure 4A:
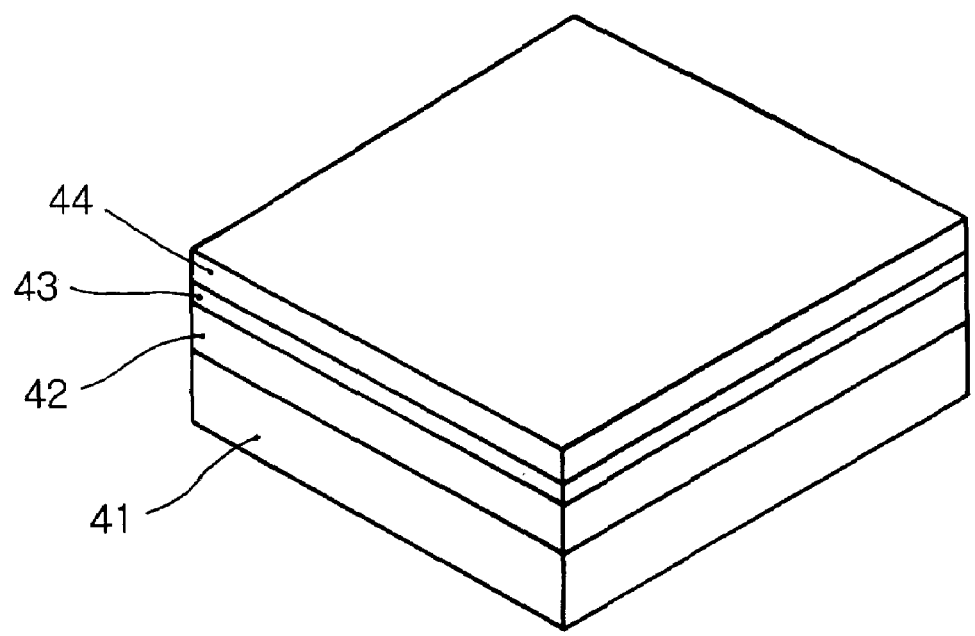
FIGS. 4a to 4d are perspective views explaining a manufacturing method of the nitride semiconductor light emitting device in accordance with the present invention.

As shown in FIG. 4a, first, onto a substrate 41 are successively stacked an n-type nitride semiconductor layer 42, an active layer 43, and a p-type nitride semiconductor layer 44. The substrate 41, for use in the growth of a certain semiconductor material, may be a sapphire substrate. The n-type nitride semiconductor layer 42, active layer 43, and p-type nitride semiconductor layer 44 may be grown by using a known MOCVD method or MBE method.

Figure 4B:
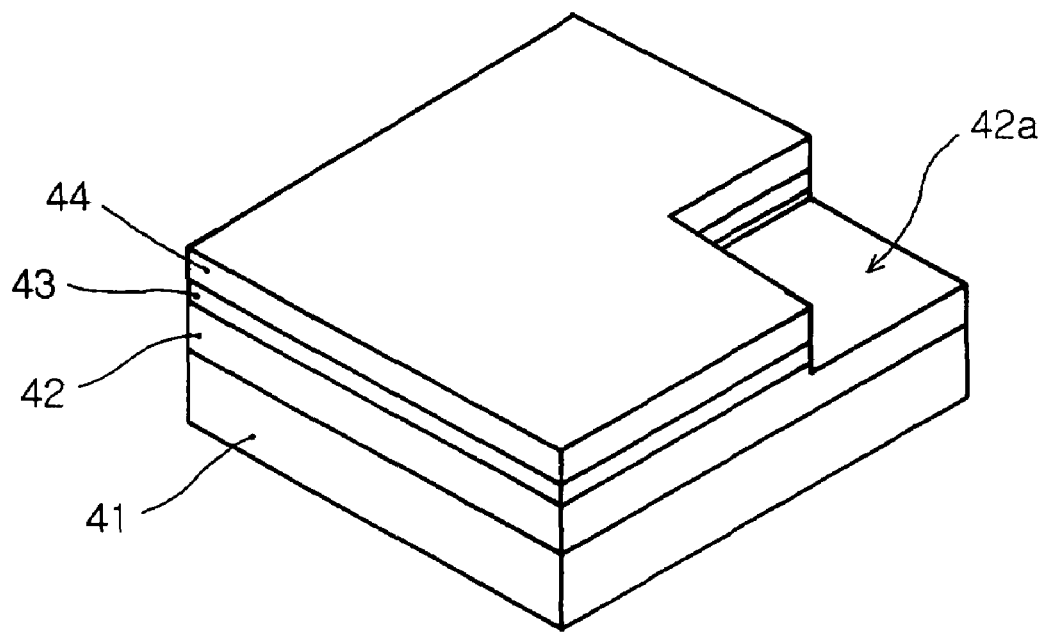

In succession, as shown in FIG. 4b, at least a part of the p-type nitride semiconductor layer 44 and at least a part of the active layer 43 are removed so as to expose a partial region 42a of the n-type nitride semiconductor layer 42. The exposed region 42a of the n-type nitride semiconductor layer 42 is used as a region where an n-side electrode will be formed. According to the present removal step, the shape of a resulting structure can be changed in various shapes depending on a position where an electrode will be formed, and further the shape and size of the electrode can be changed into various manners. For example, in the present embodiment, a corner region can be removed, and in order to achieve effective dispersion in density of electric current, the electrode takes the form of an extension disposed along an edge.

Figure 4C:
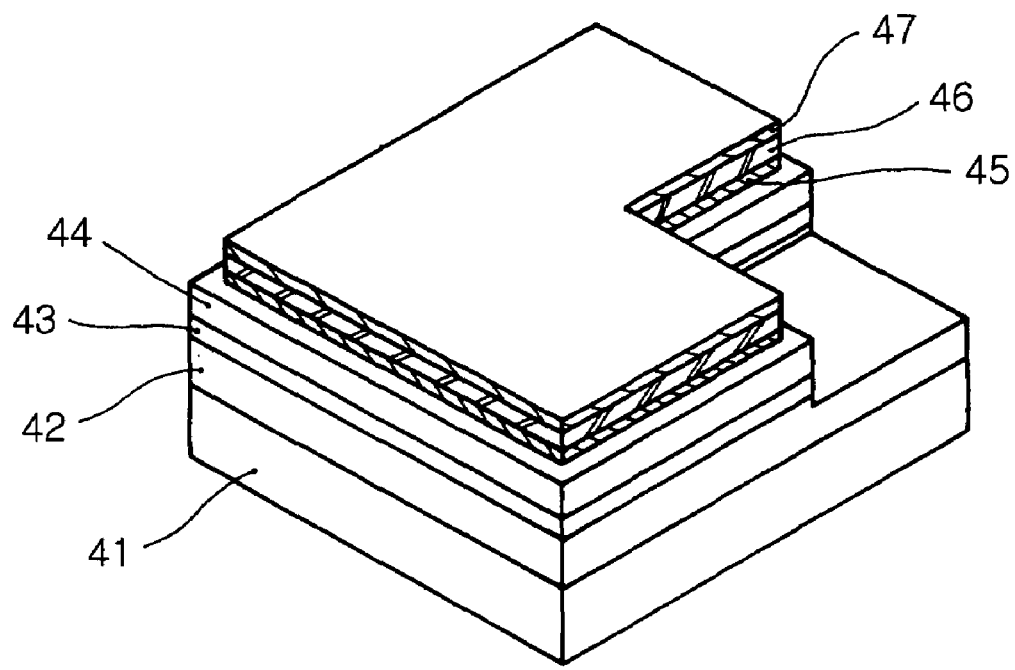

Next, as shown in FIG. 4c, onto the p-type nitride semiconductor layer 44 are successively formed a bonding force providing layer 45, a reflective electrode layer 46, and a cap layer 47. In the present invention, the bonding force providing layer 45 is formed by depositing one metal selected from among the group consisting of Ni, Co, Pd, Ir, Rh, Ru, Zn, Mg, and Sn, or alloys consisting of two or more metals selected from among the above enumerated metals on the p-type nitride semiconductor layer 44 in a thickness of 5 Å to 50 Å. The reflective electrode layer 46 is formed by depositing one metal selected from among the group consisting of Ag, Rh, and Al or alloys consisting of two or more metals selected from among the above enumerated metals on the bonding force providing layer 45 in a thickness of 500 Å to 5000 Å. The cap layer 47 is formed by depositing one metal selected from among the group consisting of Pt, Pd, and Ph on the reflective electrode layer 46 in a thickness of 100 Å or more while being smaller than that of the reflective electrode layer 46. For the deposition of the bonding force providing layer 45, reflective electrode layer 46, and cap layer 47, a known E-beam deposition or thermal deposition method may be employed.

After the bonding force providing layer 45, the reflective electrode layer 46, and the cap layer 47 are successively deposited over an upper surface of the p-type nitride semiconductor layer 44, they pass through a heat treatment process. During the heat treatment process, a part of a constituent material of the cap layer 47 penetrates the reflective electrode layer 46 and the bonding force providing layer 45 in the form of a column until it reaches to an interface between the p-type nitride semiconductor layer 44 and the bonding force providing layer 45. In this way, as a part of the constituent material of the cap layer 37 comes into contact with the interface between the p-type nitride semiconductor layer 44 and the bonding force providing layer 45 through the heat treatment process, it results in a reduction in contact resistance therebetween. The heat treatment process, preferably, is a rapid heat treatment process performed at a temperature of 400° C. to 600° C. for 1 to 5 minutes under nitrogen atmosphere. If the temperature of the heat treatment is less than 400° C., it cannot ensure smooth permeation of the constituent material of the cap layer 37. If the heat treatment temperature is more than 600° C., it may affect physical properties of the nitride semiconductor material. In addition, if the heat treatment process is performed for less than 1 minute, the constituent material of the cap layer 37 cannot achieve smooth and sufficient permeation action, whereas if the heat treatment time exceeds 5 minutes, constituent materials of the bonding force providing layer 45, reflective electrode layer 46, and cap layer 47 may react, thereby causing unexpended alloy formation. The above mentioned rapid heat treatment process is a heat treatment process using rapid temperature variation, and is effective to prevent such a reaction between the constituent materials of the bonding force providing layer 45, reflective electrode layer 46, and cap layer 47 and thus prevents formation of any alloys.

Figure 4D:
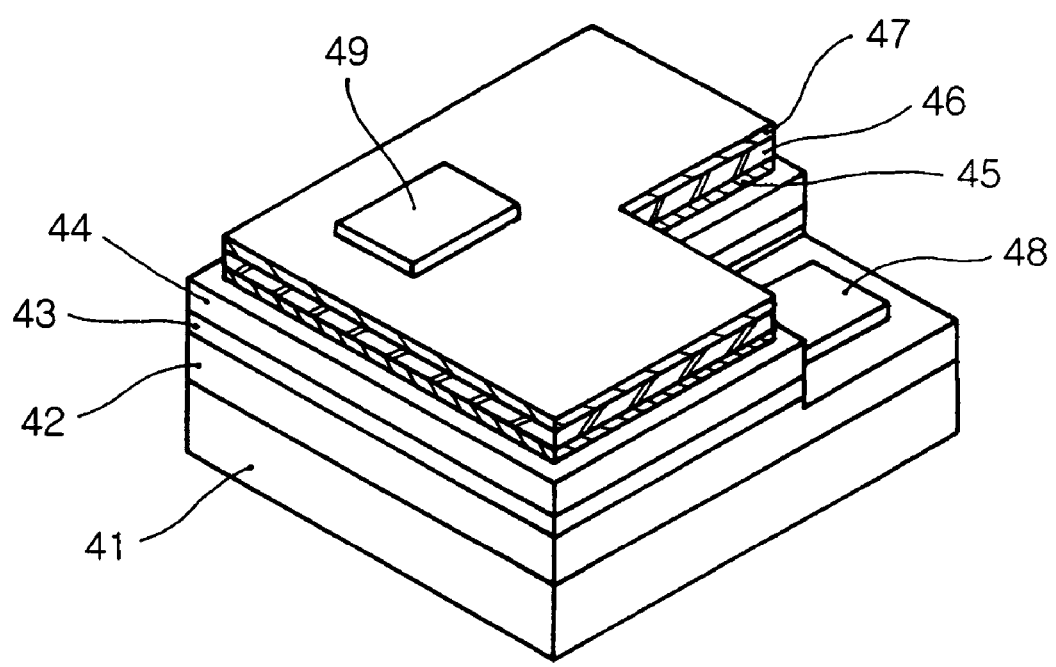

Finally, as shown in FIG. 4d, on the exposed region 42a of the n-type nitride semiconductor layer 42 and on an upper surface of the cap layer 47 are formed an n-side electrode 48 and a p-side bonding electrode 49, respectively.

As stated above, a flip chip type nitride semiconductor light emitting device in accordance with the present invention comprises a bonding force providing layer capable of providing a good bonding force between a p-metal layer and a p-type nitride semiconductor layer, thereby preventing the p-metal layer from being separated from the p-type nitride semiconductor layer. Further, the nitride semiconductor light emitting device further comprises a reflective electrode layer made of material(s) having a good reflectivity, thereby improving brightness through an increase in the amount of light to be reflected, and enhancing diffusion of electric current. Furthermore, a cap layer, provided in the nitride semiconductor light emitting device, affects to reduce contact resistance, thereby reducing driving voltage and ensuring a bonding force relative to a p-side bonding electrode.

As apparent from the above description, the present invention provides a flip chip type nitride semiconductor light emitting device comprising a bonding force providing layer capable of providing a good bonding force between a p-metal layer and a p-type nitride semiconductor layer of the device, thereby preventing a separation problem between the p-metal layer and the p-type nitride semiconductor layer.

Further, according to the present invention, by virtue of such a good bonding force provided by the bonding force providing layer, a reflective electrode layer of the nitride semiconductor light emitting device can be made of a material having a low bonding force and a good reflectivity, resulting in a considerable enhancement in brightness of the flip chip type nitride semiconductor light emitting device.

Furthermore, according to the present invention, the flip chip type nitride semiconductor light emitting device further comprises a cap layer capable of improving contact resistance, thereby achieving a reduction in driving voltage and a good bonding force relative to a p-side bonding electrode.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A flip chip type nitride semiconductor light emitting device comprising:

a) a substrate for growing a nitride semiconductor material;

b) an n-type nitride semiconductor layer formed on the substrate;
c) an active layer formed on at least a part of the n-type nitride semiconductor layer;
d) a p-type nitride semiconductor layer formed on the active layer;
e) a bonding force providing layer formed directly on the p-type nitride semiconductor layer and configured to provide a bonding force relative to the p-type nitride semiconductor layer;
f) a reflective electrode layer formed on the bonding force providing layer, and configured to reflect light produced in the active layer toward the substrate and to diffuse electric current; and
g) a cap layer formed on the reflective electrode layer, and configured to provide a bonding force between the reflective electrode layer and a bonding metal and to reduce contact resistance;
wherein the bonding force providing layer is made of one metal or alloys of two or more metals selected from the group consisting of Ni, Co, Pd, Ir, Rh, Ru, Zn, Mg and Sn;
wherein the reflective electrode layer is made of one metal or alloys of two or more metals selected from the group consisting of Ag, Rh and Al; and
wherein the cap layer is made of one metal selected from the group consisting of Pt and Pd.

2. The device of claim 1, wherein the bonding force providing layer has a thickness of from 5 Å to 50 Å.

3. The device of claim 1, wherein the reflective electrode has a thickness of from 500 Å to 5,000 Å.

4. The device of claim 1, wherein the cap layer has a thickness of 100 Å or more while being smaller than that of the reflective layer.

5. The device of claim 1, wherein the n-type nitride semiconductor layer comprises a composition being the formula:

$$Al_xIn_yGa_{(1-x-y)}N$$

wherein $$0 \leq x \leq 1, 0 \leq y \leq 1$$

and $$0 \leq x+y \leq 1.$$

6. The device of claim 5, wherein the composition comprises GaN.

7. The device of claim 1, wherein the active layer has a quantum well structure.

8. The device of claim 7, wherein the active layer is made of GaN.

9. The device of claim 7, wherein the active layer is made of InGaN.

* * * * *